United States Patent
Wu et al.

(10) Patent No.: US 6,288,584 B1
(45) Date of Patent: Sep. 11, 2001

(54) ZERO STANDBY-CURRENT POWER-ON RESET CIRCUIT WITH SCHMIDT TRIGGER SENSING

(75) Inventors: Ke Wu; David Kwong, both of Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/679,746

(22) Filed: Oct. 5, 2000

(51) Int. Cl.$^7$ .................................................. H03K 17/22
(52) U.S. Cl. ............................................. 327/143; 327/198
(58) Field of Search .................................. 327/143, 198, 327/546

(56) References Cited

U.S. PATENT DOCUMENTS

| | | | |
|---|---|---|---|
| 4,340,851 | 7/1982 | Nishikawa | 323/311 |
| 4,634,904 | 1/1987 | Wong | 307/594 |
| 4,746,822 | 5/1988 | Mahoney | 307/594 |
| 5,180,926 | 1/1993 | Skripek | 307/272.3 |
| 5,349,244 | * 9/1994 | Confalonieri | 327/198 |
| 5,374,923 | * 12/1994 | Sakamoto | 327/143 |
| 5,517,144 | * 5/1996 | Nakashima | 327/198 |
| 5,552,736 | 9/1996 | Desroches | 327/198 |
| 5,760,624 | 6/1998 | McClintock | 327/143 |
| 5,898,327 | * 4/1999 | Tanaka | 327/143 |
| 5,936,444 | 8/1999 | Pathak et al. | 327/143 |
| 6,057,721 | 5/2000 | Nolan et al. | 327/143 |
| 6,060,918 | 5/2000 | Tsuchida et al. | 327/143 |
| 6,084,388 | 7/2000 | Toosky | 323/313 |

FOREIGN PATENT DOCUMENTS

| | | | | |
|---|---|---|---|---|
| 000343872-A2 | * 11/1989 | (EP) | | 327/143 |
| 357048831 | * 3/1982 | (JP) | | 327/143 |

* cited by examiner

*Primary Examiner*—Toan Tran
(74) *Attorney, Agent, or Firm*—Stuart T. Auvinen (57) ABSTRACT

A power-up-reset circuit draws zero standby current. Rather than use a voltage divider that always draws current, a capacitive-pullup divider is used as the first stage. The capacitive-pullup divider has a capacitor to power (Vcc) and n-channel series transistors to ground. A sensing node between the capacitor and n-channel series transistors is initially pulled high to Vcc as Vcc is ramped up. The n-channel transistors remain off until Vcc reaches about 1.5 volts. Then the n-channel transistors pull the sensing node quickly to ground, ending the reset pulse. The second stage has a capacitor to ground that initially holds a threshold node low. A p-channel transistor has a gate connected to the sensing node and charges up the capacitor when the sensing node falls to ground. A third stage is triggered to change state as the capacitor is charged up by the p-channel transistor. Then a Schmidt trigger toggles, as do downstream inverter stages. A feedback signal goes low, disabling the gate of a pulldown n-channel transistor in the second stage. This disables a power-to-ground current path.

20 Claims, 4 Drawing Sheets

ZERO STANDBY-CURRENT POWER-ON RESET CIRCUIT WITH SCHMIDT TRIGGER SENSING

FIELD OF THE INVENTION

This invention relates to complementary metal-oxide-semiconductor (CMOS) integrated circuits (IC's), and more particularly for power-on reset circuits.

BACKGROUND OF THE INVENTION

Integrated circuits have become increasingly complex. Sequential IC's use flip flops or registers to store state information. The registers can often be several layers deep within the circuit, requiring several clock cycles before data from the registers can be read by the external pins of the IC. Other circuits such as voltage regulators also have internal nodes that are not easily accessible to external pins.

When an IC is powered up, these internal nodes can power up to either high or low states, or even to an intermediate metastable state. Often parasitic capacitances and resistances of these internal nodes can determine the state after power up. Such indeterminate states after power up is quite undesirable, as circuit operation may not be determinate for several clock periods after power is applied. Testability is also difficult when IC's are not powered up to a known state.

Older IC's were reset after power was applied. An external reset input pin was used to assert a global reset signal that activated internal reset circuitry, such as NAND gates within internal flip-flops and registers. However, some IC's were limited in the number of available pins and could not be reset externally. Power-up-reset circuits were developed to automatically assert an internal reset signal as the power supply (Vcc or Vdd) was ramped up from ground.

A wide variety of power-on-reset circuits have been disclosed. See for example U.S. Pat. No. 5,180,926 by Skripek, and assigned to Sequoia Semiconductor Inc. of Scotts Valley, Calif. Many such circuits employed a resistive voltage divider.

Figure 1:
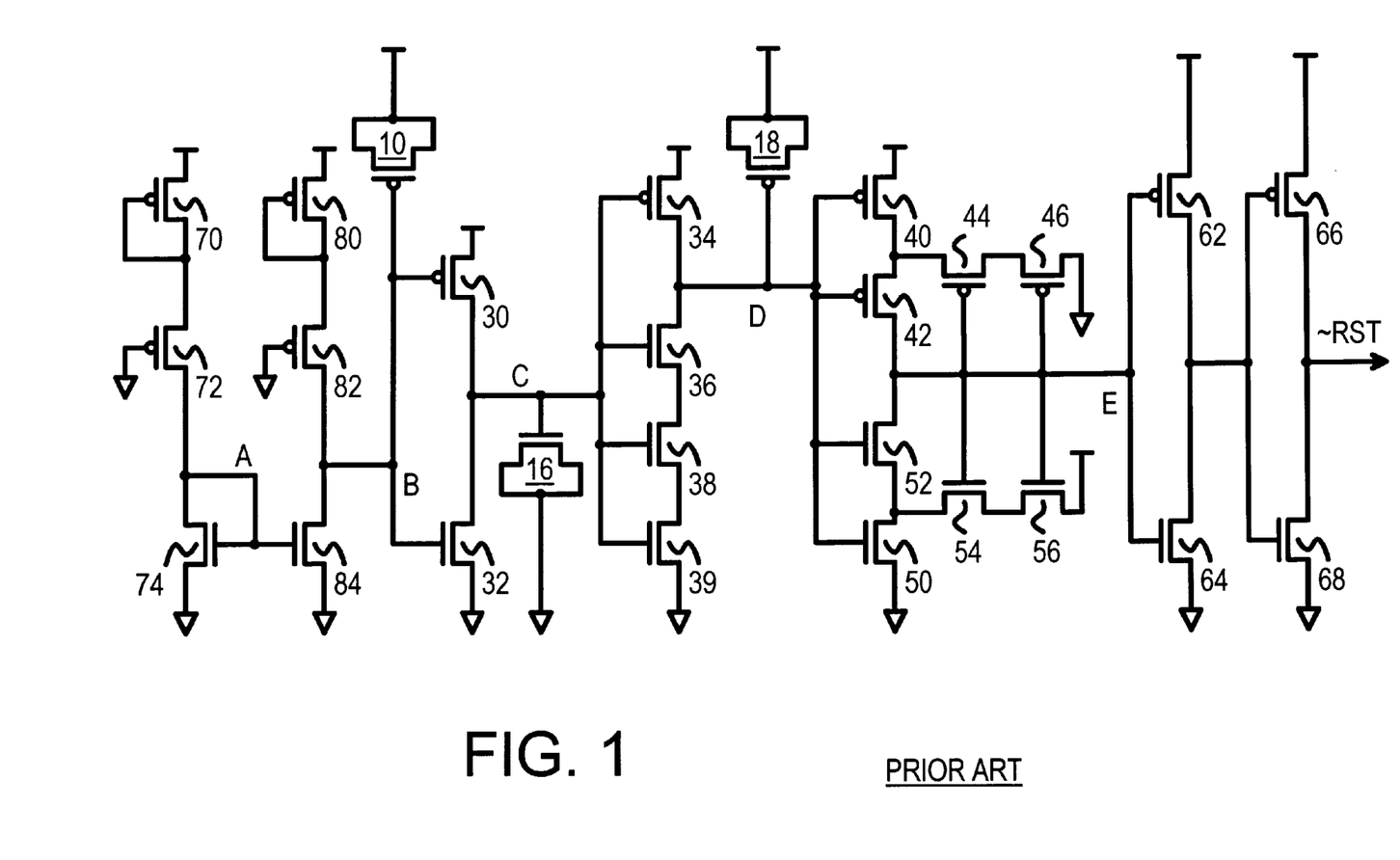
FIG. 1 is a prior-art power-on reset circuit using a voltage divider.

FIG. 1 is a prior-art power-on reset circuit using a voltage divider. Such as circuit has been used in 1997-era CMOS chips. P-channel transistors 70, 72 and n-channel transistor 74 form a voltage divider. The node A voltage of the gate of n-channel transistor 74 is set by the drain voltage of p-channel transistor 72 and n-channel transistor 74. As Vcc rises up from zero volts to a Vcc of 3 or 5 volts, the voltage of node A rises. At first, when Vcc is less than 1 or 2 volts, the node A voltage of n-channel transistors 74, 84 is less than 0.7 volt, the transistor threshold voltage. This keeps n-channel transistors 74, 84 off. P-channel transistors 80, 82 pull node B high, as does capacitor 10, which is formed from a p-channel transistor with its drain and source connected to Vcc.

The high voltage of node B is inverted by transistors 30, 32 to a low voltage on node C. Node C is also kept low by capacitor 16, an n-channel transistor with its gate and drain connected to ground. Transistors 34, 36, 38, 39 invert node C to generate a high on node D, which is also held near Vcc by capacitor 18 as Vcc rises. N-channel transistors 50, 52 pull node E low, as p-channel transistors 40, 42 remain off by the voltage of node D being near Vcc. N-channel transistors 54, 56 are held off by the low node E, while p-channel transistors 44, 46 turn on.

The low node E is inverted by transistors 62, 64 and again by transistors 66, 68 to generate a low reset signal ~RST. The low ~RST is routed to the many reset gates in the registers and flip-flops of the IC, causing these registers and flops to set or reset.

The low voltages on nodes C, E, ~RST are near ground, while the high voltage on nodes B, D are near Vcc. Since Vcc is rising from ground to about 3 or 5 volts, the "high" voltage varies—it can be 1.0 volt when Vcc is 1.2 volts, or 1.5 volt when Vcc is 2 volts.

As Vcc rises above 1.5 to 2 volts, the voltage of node A rises to above 0.7 volt. Then n-channel transistors 74, 84 turn on, since their gate-to-source voltages is above the transistor threshold voltage of 0.7 volt for a typical CMOS process. When n-channel transistor 84 turns on, it begins discharging node B and capacitor 10. Once node B falls sufficiently, transistors 30, 32 recognize node B as a low rather than a high, and drive node C high. Then transistors 34, 36, 38, 39 drive node D low, while transistors 40, 42 drive node E high. Some hysteresis is provided by transistors 44, 46. Eventually ~RST is driven high, ending the reset pulse.

While such a power-on reset circuit is useful, it draws current even when not in use. The voltage divider of transistors 70, 72, 74 remain on even after full power is reached. Also, transistors 80, 82, 84 remain on, drawing still more current. Thus a small current is consumed during normal operation of the IC by the power-on-reset circuit. While the current is only 3 or 4 micro-amps, this can still drain batteries of very-low-power devices such as portable phones and computers.

Some zero-standby-power power-on-reset circuits have been developed. See for example, U.S. Pat. No. 5,936,444 by Pathak et al., and assigned to Atmel Corp. of San Jose, Calif. While useful, other zero-standby-power power-on-reset circuits are desired, especially for low-Vcc applications. Values of parasitic devices can vary significantly with process, temperature, and voltage variations, and power-up circuits are usually designed with large guard bands to ensure operation for worst-case conditions.

What is desired is a power-on-reset circuit for a CMOS IC that does not draw current after power is ramped up. A zero-power circuit is desired. A power-up circuit that has no direct paths from power to ground is desired to reduce standby current. A power-up circuit that is less sensitive to parasitic values is desirable.

SUMMARY OF THE INVENTION

A power-on-reset circuit has a capacitive-pullup divider that outputs a sensing voltage on a sensing node. The capacitive-pullup divider has a pullup capacitor between the sensing node and a power supply, and a transistor pulldown from the sensing node to a ground.

A charging transistor has a gate controlled by the sensing node. It drives a threshold node high when the sensing voltage drops. A charging capacitor is coupled between the threshold node and the ground. A discharge transistor is coupled between the threshold node and the ground. It discharges the charging capacitor before the charging transistor turns on.

A threshold stage receives the threshold node as an input. It inverts the threshold node to drive a trigger input. A series of inverters receives the trigger input. It generates a reset signal. A reset pulse is generated on the reset signal. The reset pulse ends in response to the sensing voltage falling when the transistor pulldown turns on when the sensing voltage reaches a predetermined voltage. Thus the reset pulse is generated by the capacitive-pullup divider.

In further aspects of the invention the pullup capacitor blocks direct current flow from the power supply to the ground through the transistor pulldown. The sensing node is connected to the ground only through the transistor pulldown. The sensing node is not connected to the power supply except through the pullup capacitor. The capacitive-pullup divider draws no direct current between the power supply and the ground, direct current being blocked by the pullup capacitor.

In still further aspects of the invention the series of inverters also generates a feedback signal. The feedback signal controls the discharge transistor. The discharge transistor is disabled by the feedback signal at an end of the reset pulse. The discharge transistor blocking current from the charging transistor to the ground. Thus current is blocked by the discharge transistor after the reset pulse ends.

In other aspects the transistor pulldown is a series of n-channel transistors. The series of n-channel transistors has gates connected to the sensing node. The series of n-channel transistors turns on, driving the sensing node to the ground, when the pullup capacitor pulls the sensing voltage above a sensing threshold as the power supply is ramped up during power-up. Thus the series of n-channel transistors drives the sensing node to the ground when the sensing voltage is reached.

In other aspects the sensing voltage of the sensing node is reached when the power supply is about 1.5 volts. The charging transistor is a p-channel transistor having a source connected to the power supply and a gate connected to the sensing node and a drain connected to the threshold node. The discharge transistor is an n-channel transistor with a gate coupled to the feedback signal and a drain connected to the threshold node and a source connected to the ground. Current is conducted from the power supply to the ground through the charging and discharge transistors after the sensing voltage is driven low, but before the feedback signal goes low. Thus the feedback signal disables current flow between the power supply and the ground.

DETAILED DESCRIPTION

The present invention relates to an improvement in power-up reset generators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that portable devices require zero-standby power chips. The power-on-reset circuit also needs to draw no current after Vcc has been ramped up. To achieve zero power, all power-to-ground current paths need to be eliminated in the power-on-reset circuit.

The inventors have further realized that the voltage divider can be replaced with a capacitive-pullup divider. A capacitor acts as a short at high frequencies (A.C.), but as an open at low frequencies (D.C.). Thus the pullup capacitor couples the rising Vcc to the divider, but once the full Vcc voltage has been reached, the capacitor blocks current flow in the divider. Thus the capacitive-pullup divider draws no D.C. current.

The inventors further realize that feedback can be used to disable the power-on-reset circuit. A charging stage can initially draw current, but be disabled by the feedback signal once the charging state has charged a capacitor above a threshold of a sensing stage. Thus the feedback signal can block power-to-ground paths in the charging stage.

Figure 2:
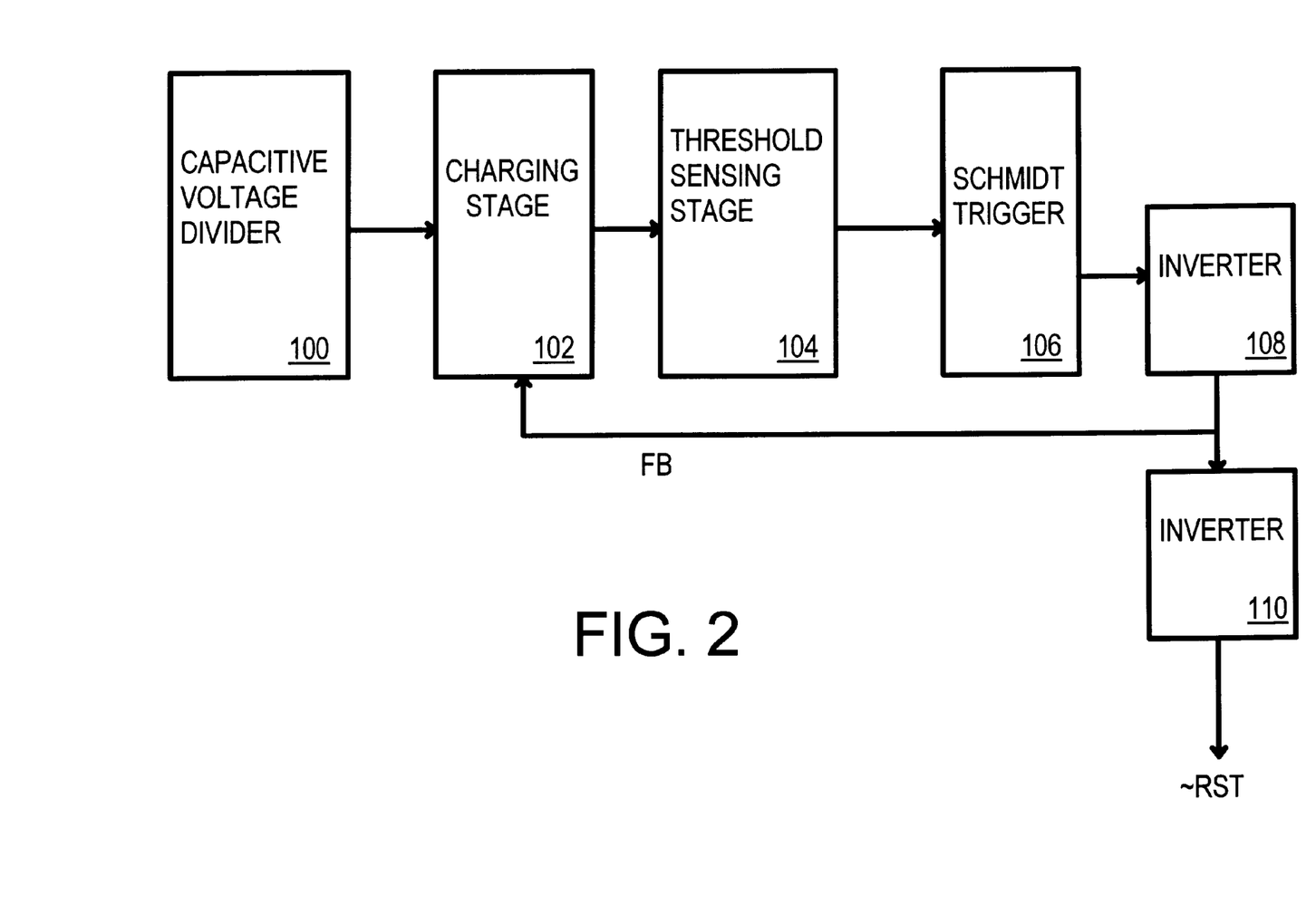
FIG. 2 is a block diagram of a zero-power power-on-reset circuit.

Block Diagram—FIG. 2

FIG. 2 is a block diagram of a zero-power power-on-reset circuit. The circuit has a series of stages. The first stage has no inputs other than power (Vcc) and ground. The first stage is capacitive-pullup divider 100. A capacitor acts as a pullup while a series of n-channel transistors form a pull-down for capacitive-pullup divider 100. This first stage acts as a capacitive-resistive voltage divider.

The second stage is charging stage 102. Charging stage 102 receives a divided voltage from capacitive-pullup divider 100 and also receives the feedback signal FB. Initially signal FB is high, causing charging stage 102 to draw current. Once the reset circuit triggers an end to the reset pulse, signal FB goes low, causing charging stage 102 to turn off and stop drawing current.

The third stage is sensing stage 104. Sensing stage 104 senses a voltage from charging stage 102 as a capacitor in charging stage 102 is charged up. Sensing stage 104 then drives Schmidt trigger 106. Schmidt trigger 106 adds hysteresis to the transition from sensing stage 104, which filters out false triggers if Vcc contains noise near the trigger point.

Inverter stages 108, 110 invert the output from Schmidt trigger 106. Inverter stage 108 drives feedback signal FB high initially, but low once Vcc rises above a trigger point of 1.4 to 1.7 volts. Inverter stage 110 drives the active-low reset signal ~RST, which pulses low to ground when Vcc is less than the trigger point of 1.4 to 1.7 volts, but tracks Vcc above the Vcc trigger point.

Figure 3:
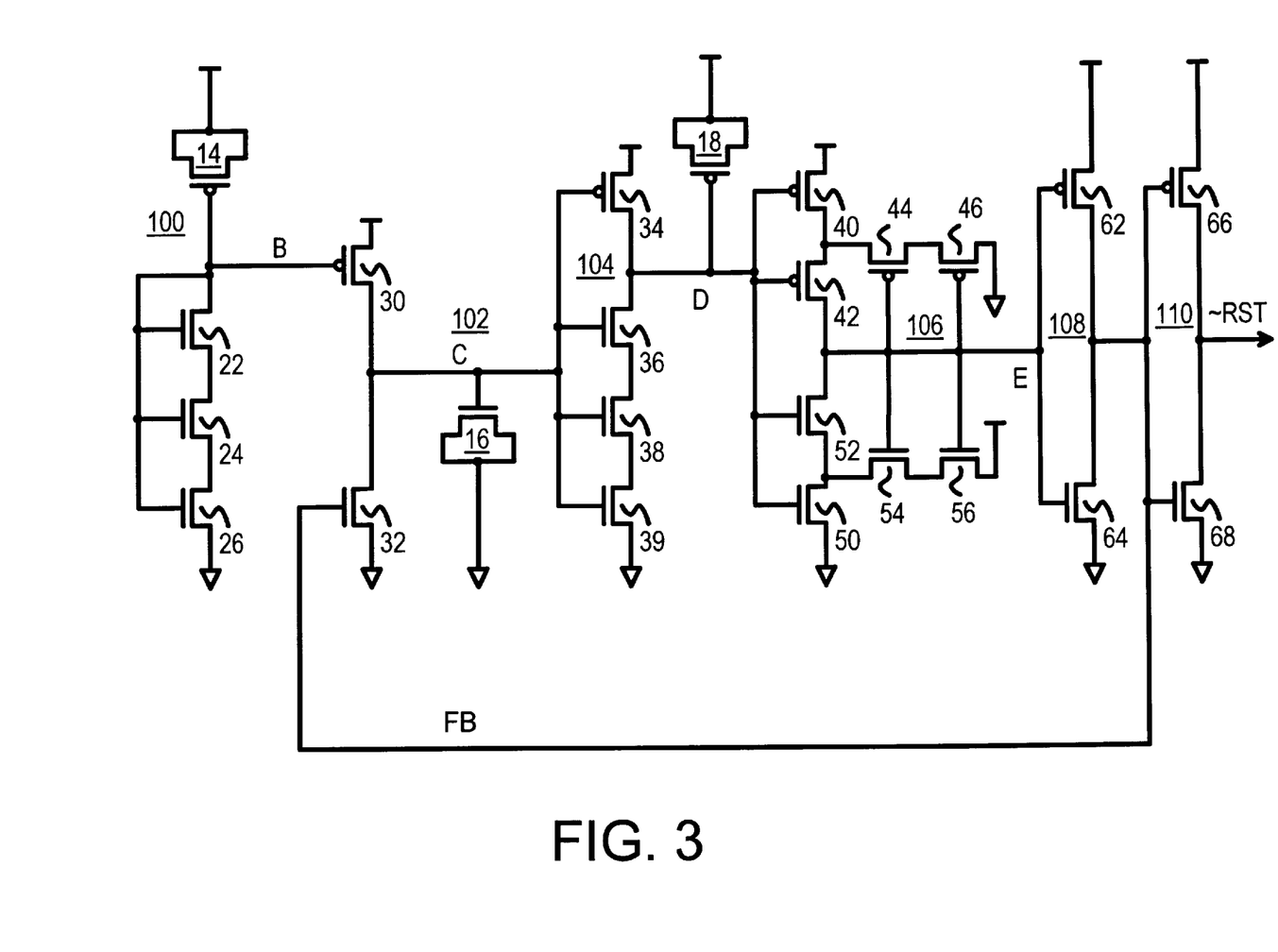
FIG. 3 is a schematic of the zero-power power-on-reset circuit.

Schematic—FIG. 3

FIG. 3 is a schematic of the zero-power power-on-reset circuit. The first stage is capacitive-pullup divider 100, which has pullup capacitor 14 to Vcc and n-channel series transistors 22, 24, 26 to ground. The gates of n-channel series transistors 22, 24, 26 are connected together and to pullup capacitor 14, forming node B. Pullup capacitor 14 is implemented as a p-channel transistor with its drain and source connected together and to Vcc and its gate to node B, which is also the drain of n-channel series transistor 22.

Charging stage 102 charges charging capacitor 16, which is an n-channel transistor with its drain and source connected to ground and its gate connected to node C. Node C is initially kept at ground by charging capacitor 16 and n-channel discharge transistor 32, which is turned on by feedback signal FB initially being high. After reset, charging capacitor 16 is charged high by p-channel charging transistor 30, which is eventually turned on by node B being driven low by n-channel series transistors 22, 24, 26.

Sensing stage 104 is a high switching threshold inverter due to the series n-channel transistors 36, 38, 39 and single p-channel pullup transistor 34. Capacitor 18 initially holds node D high. Capacitor 18 is implemented as a p-channel transistor with its drain and source connected to Vcc and its gate connected to node D, the output of sensing stage 104.

Schmidt trigger 106 is formed from p-channel transistors 40, 42, 44, 46 and n-channel transistors 50, 52, 54, 56. The gates of transistors 44, 46, 54, 56 are connected to the output, node E, providing feedback and hysteresis within Schmidt trigger 106.

Inverter stage 108 has p-channel transistor 62 and n-channel transistor 64, inverting node E to drive feedback signal FB. Inverter stage 110 has p-channel transistor 66 and n-channel transistor 68, inverting feedback signal FB to drive reset signal ~RST. Reset signal ~RST initially pulses low, then follows Vcc high after Vcc reaches the trigger point. Internal circuits such as registers and flip-flops are set or reset by reset signal ~RST pulsing low during the initial ramp up of Vcc. Reset signal ~RST can be further inverted and buffered to drive many resetable cells in a large IC.

Operation

The operation of the power-on-reset circuit of FIGS. 2, 3 is as follows: As Vcc initially ramps up from ground (zero volts) to about 1.2 volt, pullup capacitor 14 capacitivly couples node B high. Due to the inefficiencies of capacitive coupling, node B is somewhat less than Vcc, perhaps being as little as half of Vcc.

N-channel series transistors 22, 24, 26 remain off while node B is less than the transistor threshold voltage. While transistor 26 can turn on when node B reaches 0.7 volt, the n-channel transistor threshold, transistors 22, 24 have a slightly higher threshold voltage due to the body effect, since their sources are above ground. With the body effect, transistors 22, 24 remain off until node B reaches about 1.0 to 1.5 volt.

Since pullup capacitor 14 holds node B high during the initial ramp of Vcc from 0 to 1.2 volt, p-channel charging transistor 30 remains off. Charging capacitor 16 keeps node C near ground. Feedback signal FB tends to follow Vcc high during the initial Vcc ramp, causing discharge transistor 32 to turn on, holding node C at ground.

With node C low, p-channel transistor 34 in sensing stage 104 turns on once Vcc rises above 0.7 volt. N-channel transistors 36, 38, 39 remain off. This helps capacitor 18 keep node D high.

Schmidt trigger 106 drives node E low once Vcc rises above 0.7 volt, since n-channel transistors 50, 52 turn on. N-channel transistors 54, 56 connected to Vcc may initially fight against transistor 50 connected to ground, causing node E to go high to an intermediate voltage before settling low. Once node E stabilizes at ground, inverter stage 108 drives feedback signal FB high while inverter stage 110 drives reset signal ~RST low, resetting the IC registers.

As Vcc continues to ramp up, at 1.5 volt n-channel series transistors 22, 24, 26 in capacitive-pullup divider 100 begin to turn on. When transistors 22, 24, 26 turn on, node B goes low to ground. P-channel charging transistor 30 turns on, which begins charging capacitor 16. Even though discharge transistor 32 is also on, p-channel charging transistor 30 is larger, able to source about double the current sinked by n-channel discharge transistor 32. Thus capacitor 16 begins to charge up and the voltage of node C rises.

Once node C rises to above the switching threshold of sensing stage 104, p-channel transistor 34 turns off and n-channel transistors 36, 38, 39 turn on. Capacitor 18 is discharged and node D falls to ground. Schmidt trigger 106 toggles as p-channel transistors 40, 42 turn on and n-channel transistors 50, 52 turn off. P-channel transistors 44, 46 have their gates connected to the output, node E, so they initially resist the switching of Schmidt trigger 106 by driving the node between p-channel transistors 40, 42 to ground. P-channel transistor 40 is large enough to overcome the current to ground through transistors 44, 46, so eventually node E rises, turning off transistors 44, 46. This delayed switching of Schmidt trigger 106 provides immunity to noise on Vcc, since Schmidt trigger 106 does not switch back low at the same voltage it switches high.

The high voltage on node E is inverted by inverter stage 108, driving feedback node FB low. This turns off discharge transistor 34 in sensing stage 102, blocking the power-to-ground current path. Inverter stage 110 then drives reset signal ~RST high to Vcc, ending the reset pulse.

No D.C. Current Paths

There are no D.C. current paths from power to ground in the power-on-reset circuit. The first stage, capacitive-pullup divider 100, has no power-to-ground path since capacitor 14 blocks any D.C. current. The second stage, charging stage 102, has a power-to-ground path which draws some current during the reset pulse. However, once feedback signal FB goes low at the end of the reset pulse, n-channel discharge transistor 32 turns off, blocking any current to ground. Thus no D.C. path from power to ground exists in sensing stage 102 after reset is complete.

The other stages have inputs connected to both n-channel and p-channel transistors. Thus either the n-channel or the p-channel transistors turn off. Any D.C. current paths are thus blocked in sensing stage 104, Schmidt trigger 106, and inverter stages 108, 110. Since no D.C. paths between power and ground are activated in the power-on-reset circuit after reset ends, no standby power is consumed. Of course, during and immediately after reset, some charging and discharging currents occur as capacitors are charged or discharged.

Figure 4A:
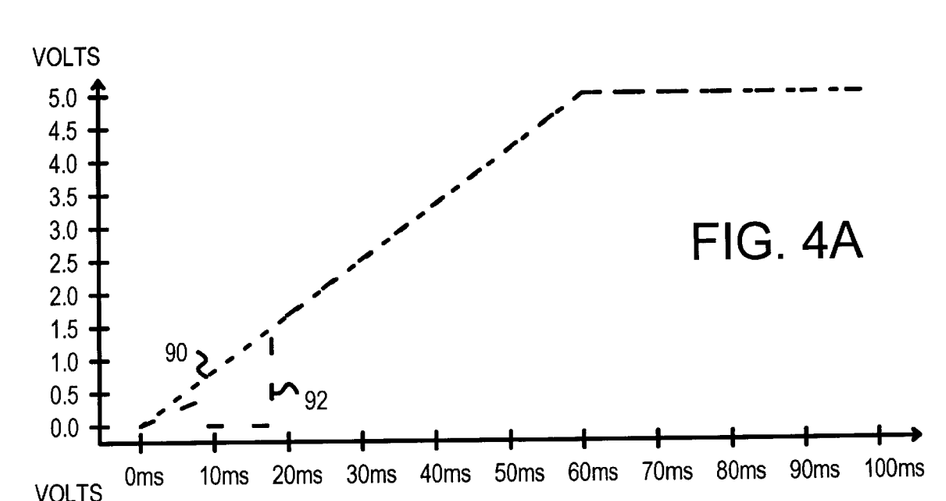
FIG. 4A is a waveform of the reset pulse generated by the power-on-reset circuit when Vcc is ramped up to 5 volts.
Figure 4B:
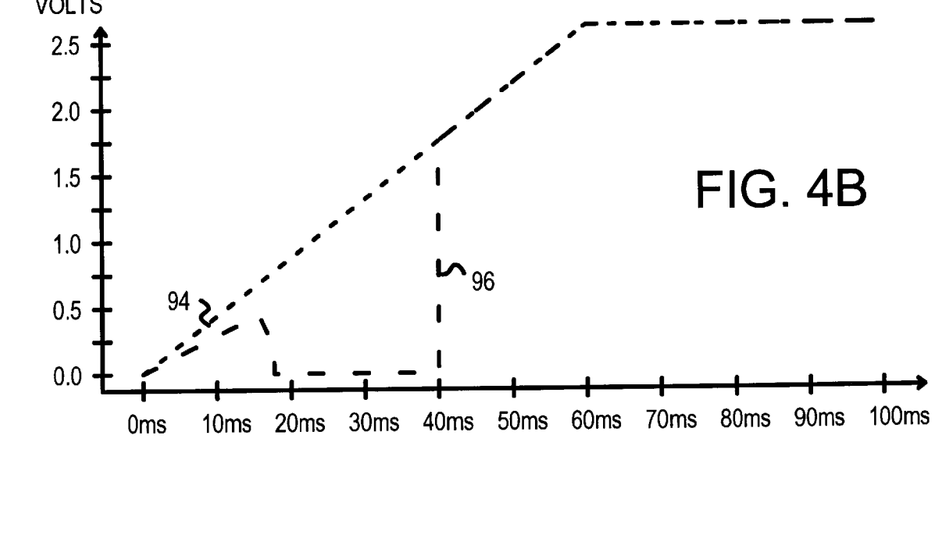
FIG. 4B is a waveform of the reset pulse generated by the power-on-reset circuit when Vcc is ramped up to 2.7 volts.

Waveforms—FIGS. 4A, 4B

FIG. 4A is a waveform of the reset pulse generated by the power-on-reset circuit when Vcc is ramped up to 5 volts. The power supply voltage is ramped from ground to 5 volts in 60 milli-seconds (ms). This is shown as waveform 90. In actual applications, the Vcc ramp may not be exactly linear, and noise may exist. However, the rapid triggering action of the first stage minimizes the noise susceptibility since the trigger voltage changes very rapidly, minimizing the time spent near the trigger point when noise could disrupt the triggering action.

The reset signal ~RST output is shown as waveform 92. The reset signal initially rises as a fraction of Vcc due to parasitic capacitances to both ground and power in the final inverter stage and the reset signal line. The transistors are all off since Vcc is less than the transistor threshold voltage of 0.7 volt. Once Vcc reaches the transistor threshold of 0.7 volt, some of the transistors can turn on. The capacitor to Vcc at node D pulls node D high, turning on the n-channel transistors in the Schmidt trigger. The output of the Schmidt trigger goes low to ground. Since Vcc is above 0.7 volt, the gate-to-source voltage of the p-channel transistor in the next inverter exceeds the transistor threshold voltage, turning it on. This pulls the input to the final inverter high, turning on the n-channel transistor in the final inverter, driving the reset signal to ground. The sharp drop of the reset signal (waveform 92) is thus seen when Vcc reaches 0.7 volt. This is the beginning of the reset pulse.

The reset pulse remains low for another 10 ms, until Vcc reaches 1.4 volt. Even though the full Vcc of 5 volts has not yet been reached, the 10 ms low-going reset pulse is long enough to set and reset internal circuits of most IC's. At Vcc=1.4 volts, the n-channel series transistors turn on in the first stage, driving from Vcc to ground the voltage from the capacitive-pullup divider. The p-channel transistor in the sensing stage then turns on, charging the charging capacitor high. The sensing stage is triggered as the capacitor is charged up. This sets off a cascade of logic inversions in the Schmidt trigger and inverters, eventually driving the reset signal high. The reset signal then follows Vcc for the rest of the Vcc ramp.

Low-power supply chips are common today, using a Vcc of 3.3, 3.0, 2.7, or lower volts. FIG. 4B is a waveform of the reset pulse generated by the power-on-reset circuit when Vcc is ramped up to 2.7 volts. The power supply voltage is ramped from ground to 2.7 volts in 60 milli-seconds (ms). This is a slower ramp than in FIG. 4A. Vcc is shown as waveform 94.

The reset signal, waveform 96, is initially a fraction of Vcc until Vcc reaches 0.7 volt and transistors can turn on. Then the reset signal ~RST is driven low by the n-channel transistor in the last inverter stage, due to upstream capacitors. The reset pulse stays low for over 20 ms due to the slower Vcc ramp and lower charging currents. Once Vcc reaches 1.75 volts the n-channel series transistors in the first stage all turn on, driving the voltage to the charging stage low. The p-channel transistor in the charging stage charges the charging capacitor, and eventually the logic threshold of the next stage is reached, and the following stages flip state. This causes the reset signal to go high at Vcc=1.75 volts. The reset signal then follows Vcc up. The feedback signal goes low, turning off the n-channel discharging transistor in the second stage, eliminating the power-to-ground current path. The circuit then becomes zero power.

ADVANTAGES OF THE INVENTION

The capacitive-pullup divider operates in an opposite manner to that of a prior-art resistive voltage divider. A normal resistive voltage divider generates a voltage that is a fraction of Vcc, such as 50% or 30% of Vcc. As Vcc rises, the fraction of Vcc also rises. When the fraction of Vcc reaches a threshold of the next stage, a trigger point is reached and the reset pulse is ended. Thus the voltage sensed in the resistive voltage divider rises up from ground until the threshold is reached.

In contrast, the voltage sensed in the capacitive-pullup divider first rises with Vcc, but then falls back to ground when the n-channel series transistors turn on. The rapid voltage drop in the capacitive-pullup divider (node B) provides a quick triggering action. In contrast, the rising voltage of a normal resistive voltage divider provides a slow trigger. Since noise may exist in the circuit, a fast voltage change near the trigger point is more desirable than a slow voltage change.

The hysteresis provided by the Schmidt trigger also provides some noise immunity. The logic threshold for the low-to-high transition of the Schmidt trigger's output is below the logic threshold for the low-to-high transition. Thus noise would have to exceed the difference in logic thresholds to upset the output.

The power-on-reset circuit is ideal for a CMOS IC since it does not draw current after power is ramped up. A zero-power circuit is possible. The power-up circuit has no direct paths from power to ground, greatly reducing standby current. The power-up circuit is less sensitive to parasitic values.

ALTERNATE EMBODIMENTS

Several other embodiments are contemplated by the inventors. For example a variety of devices can be used for the capacitors, and additional transistors can be added. Additional stages can be added. Many combinations of device sizes can be used. Circuit simulators such as SPICE can be used to optimize and verify designs.

Some small leakage currents can be drawn by the power-on-reset circuit, but these leakage currents are very small, usually less than a micro-amp for the entire circuit. The circuit has a zero standby current in the sense that no current paths are enabled between the power supply and ground after reset is over. Leakages due to thermal emissions in the silicon junctions or manufacturing defects are much smaller than transistor source-drain currents.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A power-on-reset circuit comprising:
   a capacitive-pullup divider, outputting a sensing voltage on a sensing node, the capacitive-pullup divider having a pullup capacitor between the sensing node and a power supply, and a transistor pulldown from the sensing node to a ground;
   a charging transistor, having a gate controlled by the sensing node, for driving a threshold node high when the sensing voltage drops;
   a charging capacitor coupled between the threshold node and the ground;
   a discharge transistor, coupled between the threshold node and the ground, for discharging the charging capacitor before the charging transistor turns on;
   a threshold stage, receiving the threshold node as an input, for inverting the threshold node to drive a trigger input; and
   a series of inverters, receiving the trigger input, for generating a reset signal;
   wherein a reset pulse is generated on the reset signal, the reset pulse ending in response to the sensing voltage falling when the transistor pulldown turns on when the sensing voltage reaches a predetermined voltage,
   whereby the reset pulse is generated by the capacitive-pullup divider.

2. The power-on-reset circuit of claim 1 wherein the pullup capacitor blocks direct current flow from the power supply to the ground through the transistor pulldown;
   wherein the sensing node is connected to the ground only through the transistor pulldown;
   wherein the sensing node is not connected to the power supply except through the pullup capacitor;
   wherein the capacitive-pullup divider draws no direct current between the power supply and the ground, direct current being blocked by the pullup capacitor.

3. The power-on-reset circuit of claim 2 wherein the series of inverters also generates a feedback signal, the feedback signal for controlling the discharge transistor;
   wherein the discharge transistor is disabled by the feedback signal at an end of the reset pulse, the discharge transistor blocking current from the charging transistor to the ground,
   whereby current is blocked by the discharge transistor after the reset pulse ends.

4. The power-on-reset circuit of claim 3 wherein the transistor pulldown comprises a series of n-channel transistors, the series of n-channel transistors having gates connected to the sensing node;
  wherein the series of n-channel transistors turns on, driving the sensing node to the ground, when the pullup capacitor pulls the sensing voltage above a sensing threshold as the power supply is ramped up during power-up,
whereby the series of n-channel transistors drives the sensing node to the ground when the sensing voltage is reached.

5. The power-on-reset circuit of claim 4 wherein the sensing voltage of the sensing node is reached when the power supply is about 1.5 volts.

6. The power-on-reset circuit of claim 4 wherein the charging transistor is a p-channel transistor having a source connected to the power supply and a gate connected to the sensing node and a drain connected to the threshold node;
  wherein the discharge transistor is an n-channel transistor with a gate coupled to the feedback signal and a drain connected to the threshold node and a source connected to the ground,
  wherein current is conducted from the power supply to the ground through the charging and discharge transistors after the sensing voltage is driven low, but before the feedback signal goes low,
whereby the feedback signal disables current flow between the power supply and the ground.

7. The power-on-reset circuit of claim 6 wherein the series of inverters further comprises:
  a fourth stage, receiving the trigger input, for inverting the trigger input to generate a fourth output;
  a fifth stage, receiving the fourth output, for inverting the fourth output to generate the feedback signal;
  a final stage, receiving the feedback signal, for generating the reset signal.

8. The power-on-reset circuit of claim 7 wherein the fourth stage is a Schmidt trigger having hysteresis, the fourth output transitioning high at a lower logic-threshold voltage of the trigger input than a logic-threshold voltage of the trigger input that causes the fourth output to transition low, whereby hysteresis is provided by the Schmidt trigger.

9. The power-on-reset circuit of claim 8 further comprising:
  a third capacitor, coupled between the power supply and the trigger input, for initializing the trigger input high.

10. A power-up-reset generator comprising:
  a first stage, the first stage having:
    a pullup capacitor, coupled between a power supply and a sensing node;
    n-channel series transistors having gates connected to the sensing node, for sinking current from the sensing node to a ground when the sensing node rises above a turn-on voltage for the n-channel series transistors;
  a second stage having:
    a charging p-channel transistor, having a gate coupled to the sensing node, for sourcing current from the power supply to a threshold node;
    a charging capacitor, coupled between the threshold node and the ground, for initializing the threshold node low before the sensing node reaches the turn-on voltage;
    a discharge n-channel transistor, having a gate controlled by a feedback signal, for sinking current from the threshold node to the ground until the feedback signal is activated at an end of a reset pulse;
  a third stage having:
    a pullup p-channel transistor, with a gate connected to the threshold node, for sourcing current to drive a trigger node high;
    a pulldown n-channel transistor, with a gate connected to the threshold node, for sinking current from the trigger node to the ground; and
  other stages after the third stage, for buffering the trigger node to generate the reset pulse and to generate the feedback signal;
    wherein direct current is not drawn from the power supply to the ground after the reset pulse has ended,
whereby the power-up-reset generator has zero standby power.

11. The power-up-reset generator of claim 10 wherein the n-channel series transistors comprise three n-channel transistors with sources and drains connected in series between the sensing node and the ground, the three n-channel transistors each having a gate connected to the sensing node.

12. The power-up-reset generator of claim 11 wherein the pulldown n-channel transistor in the third stage comprises three n-channel transistors with sources and drains connected in series between the trigger node and the ground, the three n-channel transistors each having a gate connected to the threshold node.

13. The power-up-reset generator of claim 12 wherein the other stages include a Schmidt trigger, the Schmidt trigger having:
  a first p-channel transistor with a source coupled to the power supply and a drain coupled to an upper node;
  a second p-channel transistor with a source coupled to the upper node and a drain coupled to an output to a next stage in the other stages;
  a third p-channel transistor with a source coupled to the upper node and a gate coupled to the output, for sinking current from the upper node to the ground;
  a first n-channel transistor with a source coupled to the ground and a drain coupled to a lower node;
  a second n-channel transistor with a source coupled to the lower node and a drain coupled to the output to the next stage in the other stages;
  a third n-channel transistor with a source coupled to the lower node and a gate coupled to the output, for sourcing current to the lower node from the power supply,
  wherein gates of the first and second p-channel transistors and the first and second n-channel transistors are coupled to the trigger node.

14. The power-up-reset generator of claim 13 wherein the Schmidt trigger further comprises:
  a fourth p-channel transistor with a source coupled to the third p-channel transistor and a gate coupled to the output and a drain coupled to the ground;
  a fourth n-channel transistor with a source coupled to the third n-channel transistor and a gate coupled to the output and a drain coupled to the power supply.

15. The power-up-reset generator of claim 14 wherein the pullup capacitor is a p-channel transistor with a gate coupled to the sensing node and a source and a drain coupled to the power supply;
  wherein the charging capacitor is an n-channel transistor with a gate coupled to the threshold node and a source and a drain coupled to the ground,
whereby capacitors are constructed from transistors.

16. The power-up-reset generator of claim 15 wherein the third stage also has:

an initializing capacitor, coupled between the trigger node and the power supply, to initialize the trigger node high to begin the reset pulse.

17. The power-up-reset generator of claim 16 wherein the other stages includes:

a first inverter, receiving the output from the Schmidt trigger, for generating the feedback signal; and a second inverter, receiving the feedback signal, for generating the reset pulse as an active-low pulse.

18. A power-up reset generator comprising:

pullup capacitor means, coupled to a power supply being ramped up during initialization, for coupling a rising power-supply voltage to a sensing node;

pulldown transistor means, coupled to the sensing node, for pulling the sensing node down to a ground after the sensing node has exceeded a turn-on threshold of the pulldown transistor means;

charging transistor means, having a gate coupled to the sensing node, for charging a threshold node in response to the pulldown transistor means pulling the sensing node down to the ground;

charging capacitor means, coupled between the threshold node and the ground, for initializing the threshold node low;

discharge transistor means, coupled to a feedback signal, for discharging the threshold node before the feedback signal is activated;

threshold gate means, receiving the threshold node as an input, for generating a trigger signal; and buffering means, receiving the trigger signal, for generating the feedback signal and for generating a reset pulse, the reset pulse ending and the feedback signal being activated in response to the pulldown transistor means pulling the sensing node to the ground, whereby the feedback signal disables the discharge transistor means to reduce standby current.

19. The power-up reset generator of claim 18 further comprising:

Schmidt trigger means, in the buffering means, for delaying transitions of the feedback signal using hysteresis of a logic switching threshold for an input to the Schmidt trigger, whereby hysteresis delays transitions.

20. The power-up reset generator of claim 18 wherein the pulldown transistor means comprises n-channel transistor in series.

* * * * *